United States Patent [19]

Mikami et al.

[11] Patent Number: 5,185,181
[45] Date of Patent: Feb. 9, 1993

[54] PROCESS FOR PREPARING AN ELECTROLUMINESCENT THIN FILM

[75] Inventors: Akiyoshi Mikami, Yamatotakada; Kousuke Terada, Tenri; Katsushi Okibayashi, Sakurai; Koichi Tanaka, Nara; Masaru Yoshida, Nara; Shigeo Nakajima, Nara, all of Japan

[73] Assignee: Sharp Kabushiki Kaisha, Osaka, Japan

[21] Appl. No.: 721,711

[22] Filed: Jun. 26, 1991

[30] Foreign Application Priority Data

Jun. 26, 1990 [JP] Japan .................................. 2-169508

[51] Int. Cl.$^5$ ............................................. B05D 5/12
[52] U.S. Cl. .................... 427/69; 427/248.1; 427/255.2; 427/294; 427/66

[58] Field of Search ................. 427/68, 64, 66, 69, 427/255.2, 248.1, 294

[56] References Cited

U.S. PATENT DOCUMENTS

3,627,569 12/1971 Beecham ......................... 427/248.1
4,171,235 10/1979 Fraas et al. ............................ 427/69

Primary Examiner—Janyce Bell

[57] ABSTRACT

A process is provided for preparing uniform and homogeneous thin films such as ZnS:M film on the substrates having a large area by CVD under a reduced pressure, wherein as many plural substrates as possible can be subjected to the CVD treatment in the same apparatus without decreasing a growth rate of the film. Accordingly, EL displays having a large area which possess a high quality and can be manufactured efficiently.

5 Claims, 6 Drawing Sheets

PROCESS FOR PREPARING AN ELECTROLUMINESCENT THIN FILM

FIELD OF THE INVENTION

The present invention relates to a process for preparing an electroluminescent thin film (EL thin film) having a large area by a chemical vapor deposition (CVD) method, the process being suitable for mass production of the EL thin film having high a quality.

BACKGROUND OF THE INVENTION

Various EL thin film elements have hitherto been known, the elements consisting of semiconductors as a luminescent basic material which are compounds of the elements belonged to II-VI groups of the periodic table such as ZnS, ZnSe, CaS, SrS and the like and additives as a luminescence center which are Mn or rare earth elements such as Tb, Sm, Ce, Eu and the like. Applied researches of these EL thin film elements on displays of various kinds of electronic apparatuses, terminals of measuring instruments and computers and planar televisions have been made.

At present, however, only the EL thin films which consist of ZnS as a luminescent basic material and Mn as a luminescence center have been put to practical use. Processes for preparing the El thin films are as follows:

(1) A vacuum evaporation method wherein a sintered pellet of a mixture of ZnS and Mn as a source material is treated by an electron beam heating method (e.g., Japanese Patent Publication No. 10358/1977; and (2) An epitaxial growth method wherein vaporized Zn and S or Mn are supplied alternately to a substrate whereon a thin film grows in an atomic monolayer unit (e.g., Japanese Patent Publication No. 35158/1982).

Besides the above methods, the following processes for preparing thin films are now under investigation in order to deal with the improvement of film quality or multicolor luminescence:

(3) A radio-frequency sputter method wherein a mixed target of ZnS and Mn is employed;

(4) An organometallic chemical vapor deposition method (OMCVD) wherein an organic compound of II group elements and hydride of VI group elements are combined through thermal decomposition on a substrate; and (5) A multisource vapor deposition method wherein solid materials of Zn,S and Mn are employed as a vapor source which can be subjected to controllable heat treatment under vacuum independently.

Furthermore, a method of chemical vapor deposition under reduced pressure using gas streams has recently been developed. In this method, solid materials of ZnS and Mn are heated and the heated ZnS vapor and Mn vapor are transported to a substrate placed in low temperature zone by means of a hydrogen gas stream (or an inert gas stream) and a hydrogen chloride gas stream respectively. A growth of the thin film occurs on the substrate through chemical deposition. This method focuses the spotlight of attention as a new process for preparing thin film because it is suitable for mass production of EL thin films having a large area and a high quality (e.g. Japanese Patent Application No. 117943/1988).

In the case where EL panel is prepared by the aforementioned growth techniques of the thin film, it is necessary to produce a homogeneous luminescent layer having a uniform film thickness over the incommensurable large area in comparison with the epitaxial growth of Si or GaAs and the like for the productivity of a semiconductor device. In addition, high productivity of the film is required. Therefore, in the conventional methods such as vacuum evaporation methods, sputter methods and OMCVD methods, which are the methods wherein the substrate on which the thin film is deposited is treated one by one in principle, an apparatus for producing the thin film must be designed in such a way that a mutual arrangement of the glass substrate and the material to be vaporized is optimized in order to deposit the vaporized material on the substrate uniformly. The productivity of these methods is lower than that of the method wherein plural substrates can be treated simultaneously.

Concerning the method wherein plural substrates can be treated simultaneously, there are some reports on an epitaxial growth on a Si wafer having a thickness of a few inches, a growth of amorphous insulating films of $Si_3N_4$ and the like and a heteroepitaxial growth of a GaAs system by the CVD method. Furthermore, it is known that a growth of thin films may occur on plural substrates in a box simultaneously (Japanese Patent Application No. 3190/1990). However, there is no newly-developed technique which makes possible a simultaneous growth of ZnS-Mn thin films on plural glass substrates having a large area.

In the case that the thin films for EL display are formed on the glass substrates having a large area, it is necessary to improve crystallinity of the thin films by CVD method under reduced pressure in order to produce a uniform and excellent luminescent layer over a large area. For an improvement of productivity of the thin films, it is necessary to increase the number of substrates on which the thin films grow simultaneously, to narrow a distance between the substrates within the limits which maintain uniformity of the thin films and to accelerate a growth rate of the thin films.

Studies and investigations on the growth of ZnS thin film by means of CVD technique have been pursued from the 1950s. For the purpose of applying the ZnS thin film to various uses such as luminescent elements, solar cells, photoconductive wave paths, optoelectronic integrated circuits and the like, the ZnS thin film has been prepared by epitaxial growth of ZnS single crystal at a high temperature (700°-800° C.) under atmospheric pressure. Although an application of the ZnS thin film to the substrate having a large area was not investigated at the commencement, non-uniformity of the film thickness came into question as the size of the wafer became larger in the field wherein thin films of Si or GaAs and the like prepared by epitaxial growth were utilized. It has been known that a film quality can be improved effectively by the CVD method under reduced pressure. Studies on film growth of ZnS by CVD under reduced pressure have been carried out from the 1970s. For example, it is described in Japanese Patent Opening No. 7715/1972 that ZnS film can be grown effectively by CVD at about 450° C. under a gas pressure of 50-300 Torr. It is known that polycrystalline ZnS film can be grown by CVD under a reduced pressure of 0.1-10 Torr (Japanese Patent Publication No. 47717/1985). According to this film growth method by CVD under a reduced pressure, an optimal gas pressure changes depending on various factors such as the kind and concentration of material gases to be used, the size and form of a substrate, the size and structure of an apparatus and the like, and a growth rate of ZnS film decreases as the gas pressure becomes lower. For these reasons, appropriate conditions for preparing ZnS films having desired properties have not been investigated.

OBJECT OF THE INVENTION

The object of the present invention is to solve aforementioned problems of known methods concerning the film growth method by CVD and to provide a process for preparing EL thin films wherein a ZnS layer is formed on a substrate having a large area by CVD, uniform distributions of film thickness and concentrations of Mn and the like so that a luminescence center can be achieved, a growth rate of the film by CVD under a reduced pressure can be increased and many substrates can be arranged within the limits which maintain uniformity of the film.

SUMMARY OF THE INVENTION

The present invention relates to a process for preparing an electroluminescent ZnS thin film comprising the steps of
(i) vaporizing zinc sulfide on zinc and sulfur as a basic material and halide of an element as a fluorescence center of the thin film, said basic material and said halide being present in plural heated side tubes connected to upper parts of a main reaction tube wherein plural substrates are arranged opposite to each other at a constant distance in a middle portion of said main reaction tube under a reduced pressure of less than 0.1 Torr,
(ii) transporting the vaporized basic material and halide from the upper parts of said main reaction tube into the middle portion of said main reaction tube by means of a carrier gas, and
(iii) producing the thin film on the plural substrates by chemical vapor deposition.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION FOR THE PREFERRED EMBODIMENTS OF THE INVENTION

Necessary conditions for mass production of the EL thin film are homogeneous film quality, uniform film thickness and increased film growth rate. In other words, it is necessary to provide an apparatus for producing a uniform thin film at a high growth rate and to select operation conditions for satisfying the necessary conditions.

In the process for preparing the thin film by the CVD method, the following two factors play determining roles in the uniformity of film thickness. One factor is a uniformity concerning temperature distribution of the substrates and the other factor is a uniformity concerning a supply of vaporized materials into a region of the main reaction tube wherein film growth occurs on the substrates. The first factor can be achieved by adopting a hot wall heating method because the temperature distribution of less than ±0.5° C. can easily be obtained by utilizing the heating method. Therefore, the second factor comes mainly into question.

In the case where a vaporized film-forming material is deposited on the substrates, the uniform supply of the material is under the control of a diffusion of the gaseous materials in the carrier gas. The linear velocity equation of the diffusion can be expressed by the following equation (1):

$$\partial Cs/\partial t = \partial(D \cdot \partial Cs/\partial x)/\partial x - KsCs \qquad (1)$$

(wherein Cs is a concentration of gaseous materials in the neighborhood of the substrates, D is a diffusion coefficient of the gaseous materials and Ks is a sticking coefficient of the gaseous materials on the substrates);

R, which indicates the film thickness and a state of the concentration distribution of elements such as Mn and the like for playing a role as a luminescence center, can be represented by the following equation (2) as the result of a steady solution of the equation (1):

$$R = Ks \cdot Cg \cdot \exp(-x/x_0) \qquad (2)$$

(wherein R is equal to $Ks \cdot Cs$, $X_0$ is equal to $\sqrt{D/Ks}$ and Cg is concentration of supplied gaseous materials).

As can be seen from the equation (2), the diffusion distance $X_0$ is a parameter indicating the uniformity of the thin film. The diffusion distance $X_0$ is a function of the diffusion coefficient D and the deposition coefficient Ks. The diffusion coefficient D depends on a kind and pressure of the carrier gas and the deposition coefficient Ks is influenced by the temperature of the substrates, spatial dimensions which relate to film growth and the way that the substrates are arranged. When a kind of the carrier gas and temperature of the substrates are fixed in the process for preparing the thin film by CVD, a uniformity of the thin film can be achieved by adjusting the pressure of the carrier gas, the size of the substrates and a space between the substrates.

According to the present embodiment, the uniform luminescent layers such as ZnS:Mn layers and the like can be formed on glass plates having a large area not only by clarifying the relation between the conditions for preparing the thin film and the diffusion distance but also by establishing the difusion distance and the way that the substrates are arranged. As described above, decreasing the gas pressure is effective for growing the uniform film to have excellent properties. However, the decrease of the gas pressure brings about a lowered concentration of the vaporized materials and a decreased growth rate of the thin film. The present embodiment provides the process for preparing the thin film without decreasing the growth rate of the thin film by making clear a rate-limiting factor of the growth rate.

According to the present embodiment, the conditions for preparing the thin film by CVD in order to obtain ZnS films having high quality are determined in the first place and the diffusion distance of the vaporized materials are also determined. The uniform growth of the thin film can be achieved by establishing the space between the plural substrates on which the films are grown simultaneously and the pressure of the vaporized materials depending on the size of the substrates based on the determined diffusion distance. The present embodiment provides the process for preparing the thin film suited for mass production wherein a decreased growth rate of the thin film can be improved by adjusting a supply rate of the vaporized materials.

EXAMPLES

The process for preparing ZnS-Mn thin films by CVD according to the present invention will be illustrated by the following examples with reference to the accompanied drawings.

EXAMPLE 1

This example was carried out in order to obtain the basic data for preparing ZnS:Mn thin films on the plural arranged substrates by CVD under reduced pressure.

Figure 1:
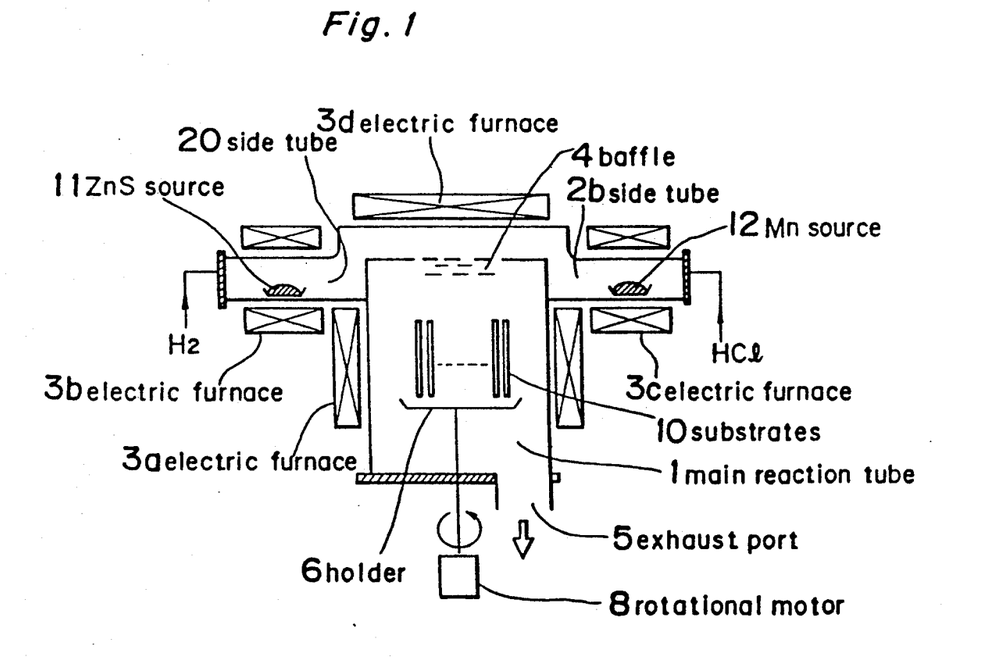
FIG. 1 is a schematic cross-sectional view of one embodiment of an apparatus for carrying out the present invention.

FIG. 1 is a schematic cross-sectional view of an apparatus for CVD under reduced pressure employed in the example. The side tubes (2a) and (2b) contain a boat carrying a material of ZnS (11) and a boat carrying a material of Mn (12) respectively, the side tubes (2a) and (2b) being connected to the upper parts of the main reaction tube (1). The side tubes (2a) and (2b) are surrounded by electric furnaces (3b) and (3c) respectively and heated to 700°-1100° C. The vaporized materials of ZnS and Mn are transported to the main reaction tube (1) by means of carrier gases $H_2$ and HCl respectively. The transported gaseous materials are mixed with each other by means of a baffle (4) heated sufficiently by electric furnace (3d), the baffle (4) being arranged in the upper part of the main reaction tube (1). The mixed gaseous materials produce films through chemical reaction on the substrates (10) arranged opposite to each other in a row in the middle part of the main reaction tube (1), the middle part being heated to 400°-600° C. by means of electric furnace (3a). The substrates (10) are supported by a holder (6) which is rotated in the main reaction tube (1) by means of a rotary motor (8) in order to grow the films on the glass substrates (10) uniformly. Undeposited gaseous materials are exhausted through an exhaust port (5) arranged in the lower part of the main reaction tube (1) by means of a vacuum pump (not shown) connected to the exhaust port.

Figure 2:
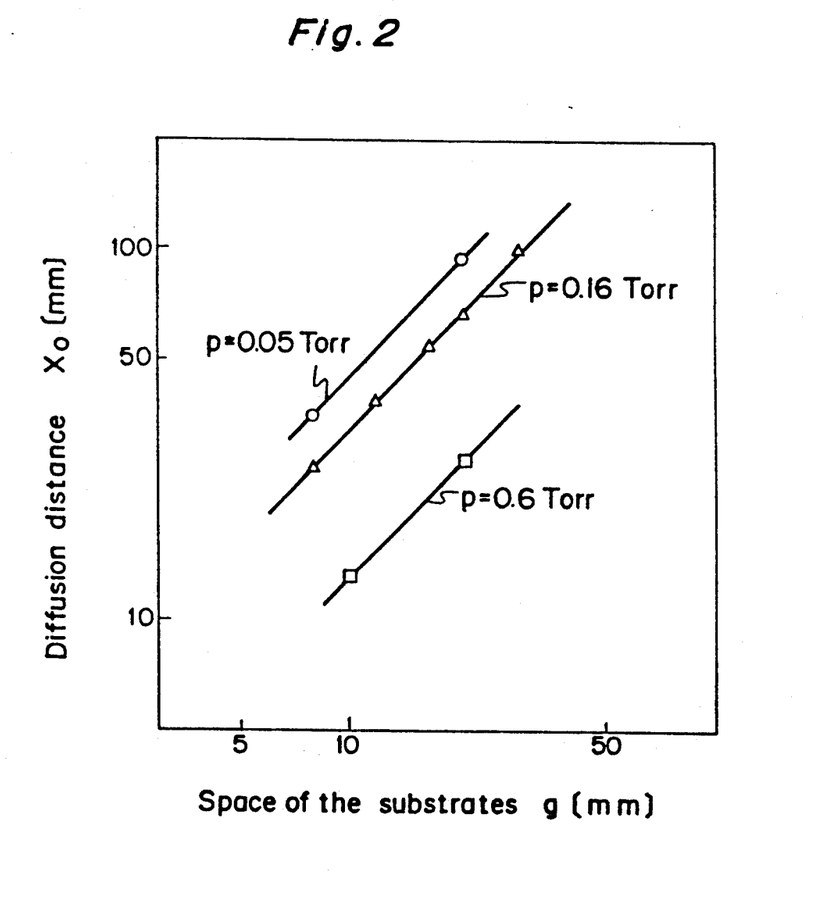
FIG. 2 is a graph showing the relation between the space of the substrates and the diffusion distance of vaporized materials under various gas pressures in Example 1.

Before the desired experiment for preparing the thin film on the substrates having a large area, the following experiment was carried out in order to determine the one dimensional diffusion distance $X_O$. Slender glass plates (ca. 10 mm × 150 mm) inserted in glass tubes having an inner diameter of about 10 mm and one sealed end were arranged on the holder (6) and CVD under reduced pressure was carried out by means of the aforesaid apparatus to produce a ZnS-Mn thin film on the slender glass plates. The distribution of the Mn concentration in the ZnS-Mn thin film on the slender glass plates was analyzed quantitatively by means of an electron probe X-ray microanalyzer. According to this analysis, the distribution of the Mn concentration shows, as estimated from the aforesaid theoretical equation (2), a positional distribution which monotonously decreases exponentially from the substrates arranged in the opened part of the glass tube. As shown in FIG. 2, the diffusion distance $X_0$ calculated from the experimental data varies depending on the space g (mm) between the substrates and the gas pressure p (Torr). In FIG. 2, the space of the substrates is equal to the inner diameter of the glass tube used the experiment.

The obtained results can be expressed by the following experimental equation (3):

$$X_0 = g/\sqrt{p} . \tag{3}$$

The equation (3) can qualitatively be understood from the fact that the diffusion coefficient D is inversely proportional to the gas pressure p and the sticking coefficient Ks depends on the space g between the substrates.

Figure 3:
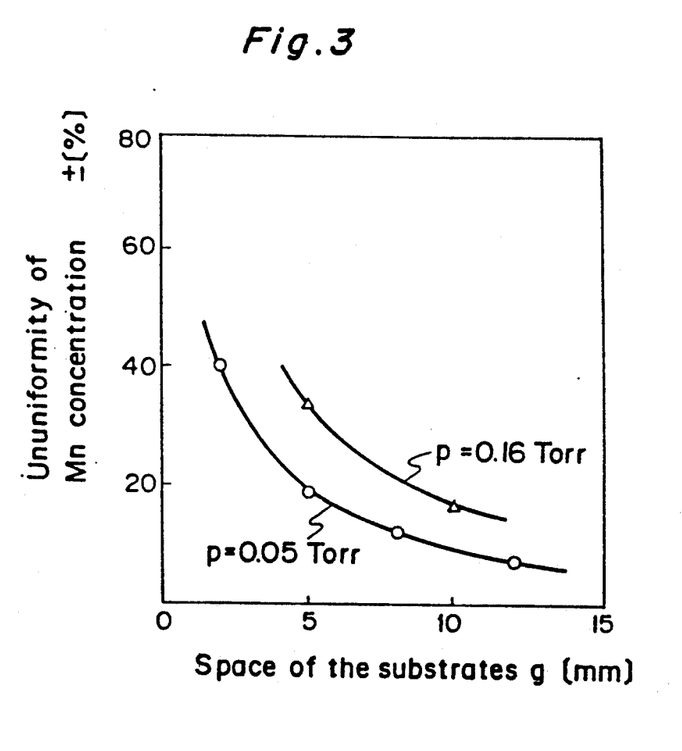
FIG. 3 is a graph showing the relation between the space of the substrates whose thickness is 6 inches and non-uniformity of Mn concentration of the EL thin film at 0.16 Torr or 0.05 Torr in Example 1.

A distributive uniformity of the Mn concentration was investigated by varying the gas pressure p and the space g of ten glass substrates (140 mm × 170 mm) for an EL panel whose size is 6 inches, the glass substrates being arranged on the holder 6 at regular intervals. The obtained results are shown in FIG. 3.

A required uniformity of luminescence brightness for the conventional EL display corresponds to more than 70% of the ratio of the minimum value to the maximum value. A required distributive difference of the Mn concentration is less than ±15%. The conditions for preparing the thin films having these required properties are shown in FIG. 4 wherein the minimum values which relate to the space g of the substrates and the gas pressure p are shown for the substrates having different sizes.

Figure 4:
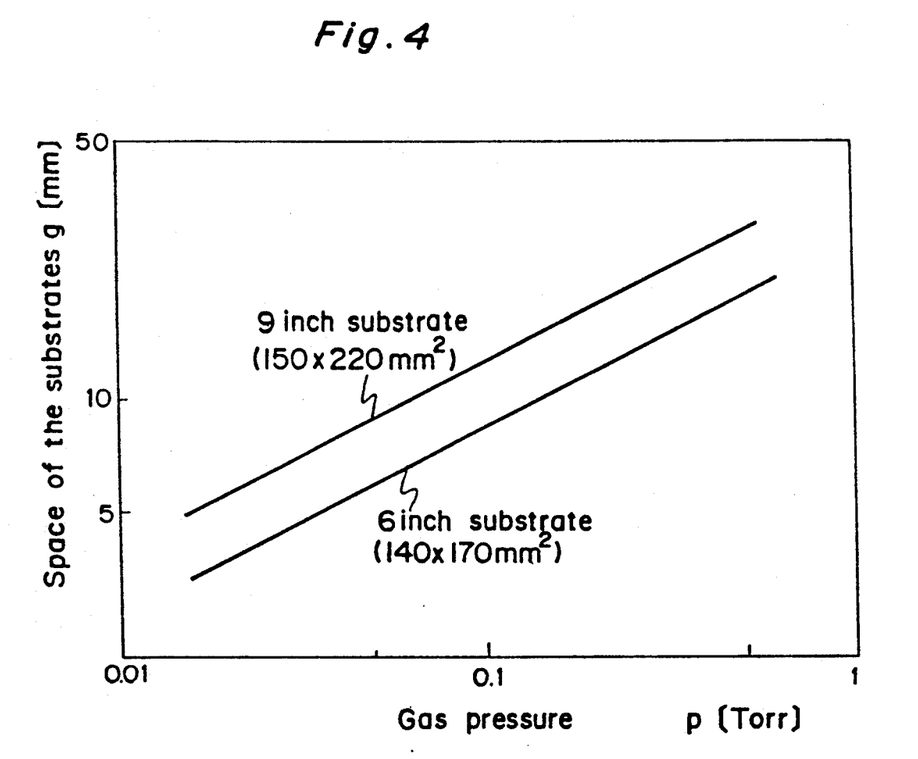
FIG. 4 is a graph showing the limitary relation between the gas pressure and the space of the substrates which is necessary to achieve uniformity of Mn concentration of the EL thin film in Example 1.

As shown in FIG. 4, the lower the gas pressure, the less the space of the substrates can be narrowed. However, in the case where the substrates whose sizes are approximately 6-10 inches for practical EL displays are arranged at regular intervals, the gas pressure which is necessary to obtain a sufficient uniformity of the luminescence becomes about 0.1 Torr and a high enough growth rate of the thin films cannot be achieved. From the viewpoint of mass production, it is disadvantageous to increase the growth rate of the thin film by widening the space of the substrates and by increasing the gas pressure because a cycle of the processes cannot be quickened by an inverse proportion to the numbers of the substrates which can be treated simultaneously.

EXAMPLE 2

In this example, an experiment to prepare a ZnS:Mn film was carried out and a distributive uniformity of the film thickness was investigated, the experiment being substantially the same as that described in Example 1.

Figure 5:
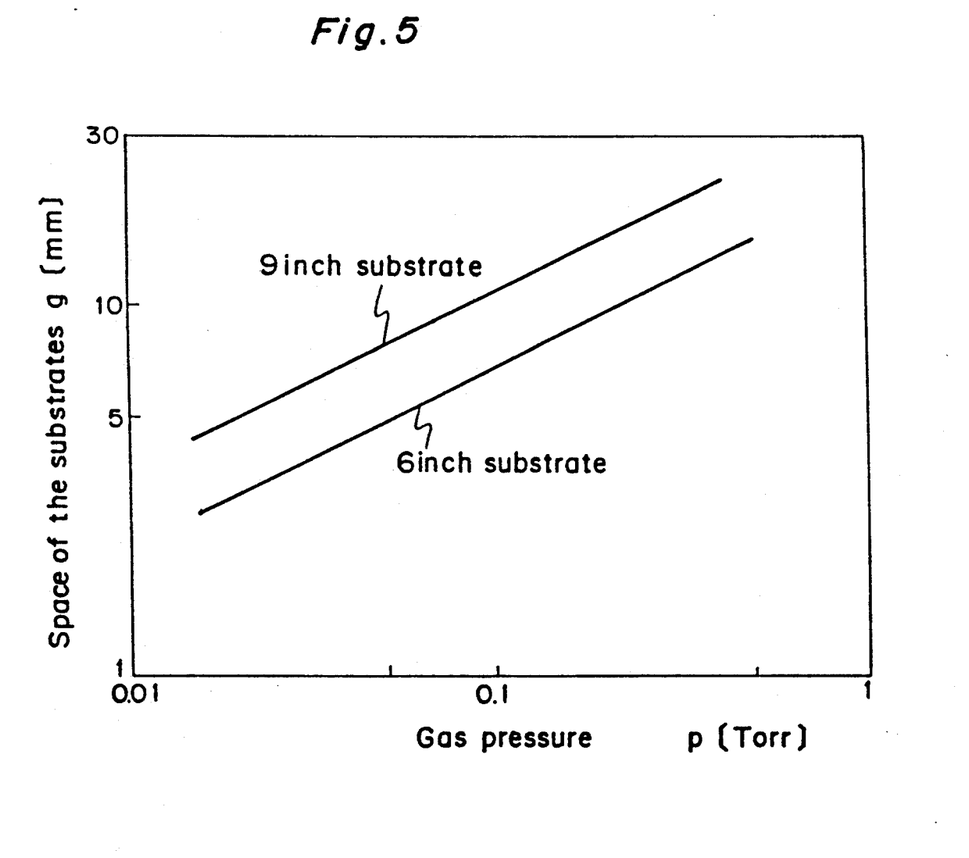
FIG. 5 is a graph showing the limitary relation between the gas pressure and the space of the substrates which is necessary to achieve uniformity of the thickness of the EL thin film in Example 2.

The constitutive elements Zn and S of ZnS have higher vapor pressures and smaller deposition coefficients in comparison with Mn which is selected as a luminescence center. The values of 400-500 mm for $X_0$ are obtained from the results of the same one dimensional diffusion experiment as carried out in Example 1. The uniformities of film thickness for the spaces 5 mm and 2 mm of the substrates for the panel whose size is 6 inches are ±2% and ±5% respectively. The distributive uniformity of the film thickness required from the viewpoint of luminescence brightness is approximately ±2% after consideration of the gradation display for the EL display. Therefore, the obtained uniformities of film thickness are excellent. The relation between the space of the substrates and gas pressure which satisfies the above required conditions for preparing the thin film is shown in FIG. 5 as in the case of FIG. 4 of Example 1. As can be seen from FIG. 5, it is necessary to decrease the gas pressure to less than 0.1 Torr in order to make the space of the substrate 10 mm wide or less.

In the case of the Examples according to the present invention, the gaseous materials for the growth of ZnS film and HCl which is a carrier gas for Mn are transported in a mixed state. The thin film having an uniform film thickness can relatively easily be prepared because HCl makes the deposition coefficient of the gaseous materials smaller and increases a uniformity of the film thickness. However, in the case where, for example, an undoped ZnS film is grown without using HCl gas, it is necessary to reduce the gas pressure in the Example to 0.05 Torr in order to obtain a uniformity of the film thickness.

EXAMPLE 3

This example relates to an improvement on a transport of the gaseous materials for ZnS-Mn thin films.

Generally speaking, the growth rate of ZnS-Mn films by CVD under reduced pressure becomes smaller with a decrease of the gas pressure in the apparatus for producing the ZnS-Mn thin film. According to a conventional technical idea, the decrease of the gas pressure brings about a concentration decrease of the gaseous materials which decreases the amounts of the gaseous materials to be deposited on the surface of the substrates. However, the following fact has been found by investigating a transport mechanism of the gaseous materials and a growth process of the film in detail. The growth rate of the film is proportional to a transport rate of the gaseous materials which corresponds to a supply rate thereof, the transport rate W being represented by the following equation (4):

$$W = a \cdot S \cdot F^n \cdot \exp(\Delta E / kt) \quad (4)$$

(wherein a is a proportionality constant, S is a surface area of the ZnS source, F is a flow rate of a carrier gas, n is a value of from ¼ to 1/5, $\Delta E$ is an activation energy of 60 Kcal/mole, T is the temperature of the source and k is the Boltzmann constant).

The transport mechanism according to the equation (4) is based on the following thermal decomposition reaction:

$$ZnS \rightarrow Zn + \tfrac{1}{2}S_2.$$

The dependence of the transport rate on the flow rate of a carrier gas is relatively low. The transport rate depends mainly on the temperature of the source and a surface area of the source.

Figure 6:
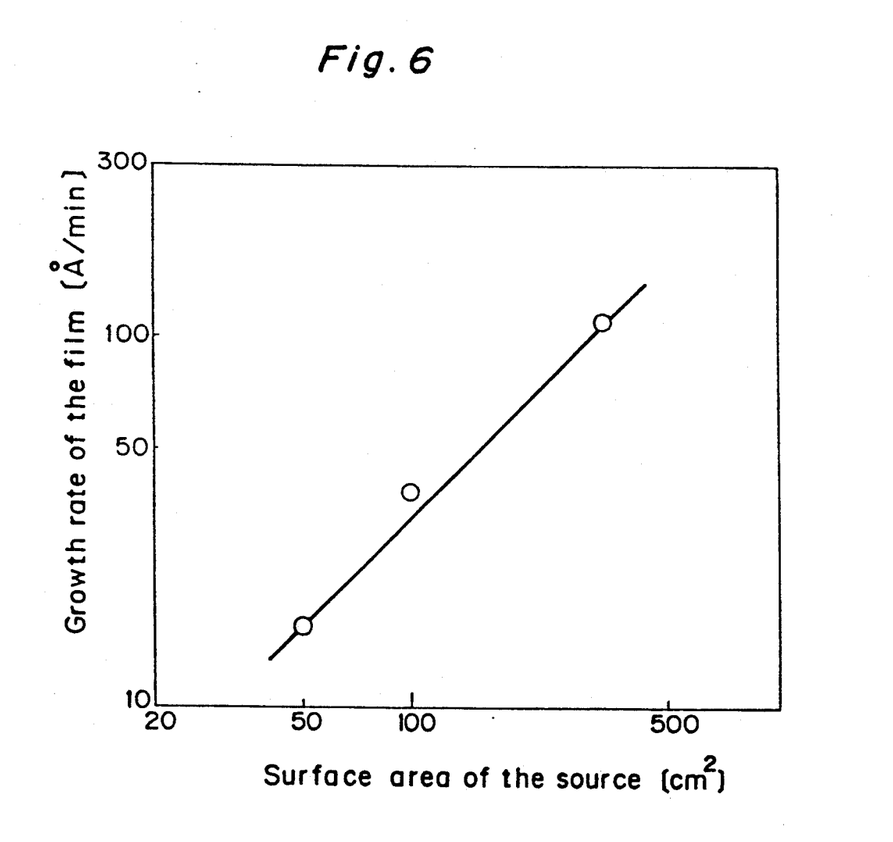
FIG. 6 is a graph showing the relation between the surface area of the material sources and the growth rate of the EL thin film in Example 3.

The relation between a surface area of the source and a growth rate of the film is shown in FIG. 6 wherein the gas pressure is 0.05 Torr and the source temperature is 1000° C. As can be seen from FIG. 6, it is possible to attain the film growth rate of more than 100 Å/min in spite of a low pressure (0.05 Torr). Therefore, an EL film whose thickness is 5000 Å can be prepared within an hour. In this process for preparing the EL the film, the increase of film growth rate does not bring about the changes of distributive uniformities of the film thickness and the Mn concentration.

On the basis of the above concerning the conditions for preparing the thin film EL panels which were manufactured by means of the aforementioned apparatus for preparing the thin film by CVD under a reduced pressure on the following conditions:

Size of the substrates; 9 inches
Space of the substrates; 9 mm
Gas pressure; 0.05 Torr
Film growth rate; 110 Å/min. A luminescence property of the EL panels was measured. The uniformity of luminescence brightness of the EL panels was more than 90%. The distribution uniformities of the film thickness and the Mn concentration of the EL films prepared simultaneously were excellent and there was no difference between the EL panels with respect to properties thereof.

As can be understood from the aforesaid graphs which show the results of the Examples according to the present invention, it is necessary to select more than 25 as a value of $g(mm)/\sqrt{p(Torr)}$ (wherein p is a gas pressure in the main reaction tube and g is a space of the substrates whose size is 6 inches arranged opposite to each other at regular intervals) in order to grow uniform films on the substrates. In other words, the limiting value of $g\sqrt{p}$ for the growth of uniform films is approximately 25.

Although the present invention is illustrated by the aforesaid Examples, the present invention is not restricted to these Examples. For example, an inert gas such as argon, herium or a mixture thereof may be employed as a substitute for $H_2$ gas which is a carrier gas.

As a substitute for the halide of Mn such as $MnCl_2$, which is added to ZnS film as a luminescence center, a halide of Tb, Tm, Ce, Eu, Pr, Sb, Sn or Bi, which shows approximately the same vapor pressure curve as that of $MnCl_2$, may be employed because the distribution of the Mn concentration depends on the vapor pressure of $MnCl_2$ in the neighborhood of the substrates.

Furthermore, although standard substrates whose size is 6-9 inches are used for the EL displays, EL films having excellent properties can be grown with high productivity on the substrates whose size is different from that of the standard substrates according to the present invention. For example, in the case where EL films are grown on the substrates whose size is smaller than that of the substrates used in the aforesaid Examples, it is possible to relax more or less restrictions on the claimed condition of $25 < g/\sqrt{p}$ and to make the space of the substrates narrower.

The present invention provides the process for preparing uniform and homogeneous thin films such as ZnS-M film on the substrates having a large area by CVD under reduced pressure, wherein as many plural substrates as possible can be subjected to the CVD treatment in the same apparatus without decreasing a growth rate of the film. According to the present invention, EL displays having a large area which possess a high quality can be manufactured efficiently.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for preparing an electroluminescent ZnS thin film comprising the steps of:
   (i) vaporizing zinc sulfide or zinc and sulfur as a basic material and halide of an element as a fluorescence center of the thin film, said basic material and said halide being present in plural heated side tubes connected to upper parts of a main reaction tube wherein plural substrates are arranged opposite to each other at a constant distance in said main reaction tube under a reduced pressure of less than 0.1 Torr;
   (ii) transporting the vaporized basic material and said halide from the upper parts of said main reaction tube into said main reaction tube by means of a carrier gas;
   (iii) producing the thin film on the plural substrates by chemical vapor deposition; and
   (iv) exhausting residual vaporized materials by exhausting means arranged at a lower part of said main reaction tube.

2. The process according to claim 1, wherein a space g(mm) of the plural substrates and a gas pressure p(Torr) in the main reaction tube satisfy the following conditions:

$$25 < g/\sqrt{p}.$$

3. The process according to claim 1 or 2, wherein the carrier gas is one gas or mixed gases selected from the class consisting of $H_2$ gas, He gas and Ar gas.

4. The process according to claim 1 or 2, wherein the element as a luminescence center is selected from the class consisting of Mn, Tb, Tm, Ce, Eu, Pr, Sb, Sn and Bi.

5. The process according to claim 3, wherein the element as a luminescence center is selected from the class consisting of Mn, Tb, Tm, Ce, Eu, Pr, Sb, Sn and Bi.

* * * * *